United States Patent
Campbell et al.

(10) Patent No.: US 9,357,675 B2
(45) Date of Patent: May 31, 2016

(54) PUMP-ENHANCED, IMMERSION-COOLING OF ELECTRONIC COMPONENT(S)

(71) Applicant: INTERNATIONAL BUSINESS MACHINES CORPORATION, Armonk, NY (US)

(72) Inventors: Levi A. Campbell, Poughkeepsie, NY (US); Richard C. Chu, Hopewell Junction, NY (US); Milnes P. David, Fishkill, NY (US); Michael J. Ellsworth, Jr., Poughkeepsie, NY (US); Madhusudan K. Iyengar, Foster City, CA (US); Roger R. Schmidt, Poughkeepsie, NY (US); Robert E. Simons, Poughkeepsie, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 239 days.

(21) Appl. No.: 14/058,530

(22) Filed: Oct. 21, 2013

(65) Prior Publication Data

US 2015/0109735 A1   Apr. 23, 2015

(51) Int. Cl.
*H05K 7/20* (2006.01)
*B23P 15/26* (2006.01)

(52) U.S. Cl.
CPC ............ *H05K 7/20318* (2013.01); *B23P 15/26* (2013.01); *H05K 7/203* (2013.01); *H05K 7/2079* (2013.01); *H05K 7/20781* (2013.01); *B23P 2700/10* (2013.01); *Y10T 29/49361* (2015.01)

(58) Field of Classification Search
CPC .......... H05K 7/20318; H05K 7/20327; H05K 7/20418
See application file for complete search history.

(56) References Cited

U.S. PATENT DOCUMENTS 5,168,919 A   12/1992   Berenholz et al.
5,212,626 A   5/1993    Bell et al.
(Continued)

FOREIGN PATENT DOCUMENTS

WO   2010/019517 A1   2/2010

OTHER PUBLICATIONS

Hwang et al., "Cold Plate for Thermal Conduction Module with Reduced Water Flow Resistance, Increased Fin Area, and Improved Water Turbulence", IBM Technical Disclosure Bulletin, IPCOM000061255D, vol. 29, No. 2, Jul. 1986.
(Continued)

*Primary Examiner* — Anthony Haughton
*Assistant Examiner* — Matt Dhillon
(74) *Attorney, Agent, or Firm* — Steven Chiu, Esq.; Kevin P. Radigan, Esq.; Heslin Rothenberg Farley & Mesiti P.C.

(57) ABSTRACT

Cooling apparatuses and methods of fabricating thereof are provided which facilitate pumped immersion-cooling of an electronic component(s). The cooling apparatus includes an enclosure having a compartment accommodating the electronic component(s), and dielectric fluid within the compartment at least partially immersing the electronic component(s). A liquid-cooled heat sink is associated with the enclosure to cool at least one cooling surface associated with the compartment, and facilitate heat transfer to the heat sink from the electronic component(s) via the dielectric fluid. A pump is disposed external to the compartment and in fluid communication therewith to facilitate pumped dielectric fluid flow through the compartment. The pumped dielectric fluid flow through the compartment enhances heat transfer from the electronic component(s) to the liquid-cooled heat sink via the cooling surface(s). In one implementation, the pumped dielectric fluid flow provides two-phase cooling to the electronic component(s) via flow boiling.

19 Claims, 10 Drawing Sheets

(56) References Cited

U.S. PATENT DOCUMENTS

| | | | |
|---|---|---|---|
| 5,305,184 A | 4/1994 | Andresen et al. | |
| 6,054,676 A | 4/2000 | Wall et al. | |
| 7,184,269 B2 | 2/2007 | Campbell et al. | |
| 7,236,363 B2 | 6/2007 | Belady et al. | |
| 7,295,440 B2 | 11/2007 | Ganev et al. | |
| 7,365,973 B2* | 4/2008 | Rasmussen | H05K 7/2079 361/694 |
| 7,372,698 B1* | 5/2008 | Tilton | H05K 7/20772 165/104.33 |
| 7,400,505 B2* | 7/2008 | Campbell | H05K 7/20772 165/185 |
| 7,907,406 B1 | 3/2011 | Campbell et al. | |
| 7,961,475 B2 | 6/2011 | Campbell et al. | |
| 8,014,150 B2 | 9/2011 | Campbell et al. | |
| 8,059,405 B2 | 11/2011 | Campbell et al. | |
| 8,230,906 B2* | 7/2012 | Campbell et al. | 165/80.4 |
| 8,274,790 B2* | 9/2012 | Campbell | H05K 7/20781 165/104.33 |
| 8,345,423 B2* | 1/2013 | Campbell | F28D 15/0233 165/104.33 |
| 8,490,679 B2* | 7/2013 | Campbell | F28D 15/02 165/104.21 |
| 8,602,092 B2* | 12/2013 | Lenehan | H01L 23/34 165/247 |
| 8,774,980 B2* | 7/2014 | Chang et al. | 700/300 |
| 2006/0180300 A1* | 8/2006 | Lenehan | H01L 23/34 165/247 |
| 2007/0227708 A1* | 10/2007 | Hom | G06F 1/20 165/121 |
| 2007/0227710 A1* | 10/2007 | Belady | H05K 7/2079 165/122 |
| 2009/0080152 A1 | 3/2009 | Conn et al. | |
| 2010/0103618 A1* | 4/2010 | Campbell | H05K 7/20772 361/699 |
| 2010/0290190 A1 | 11/2010 | Chester et al. | |
| 2010/0326628 A1* | 12/2010 | Campbell | F28D 15/02 165/104.21 |
| 2010/0328889 A1 | 12/2010 | Campbell et al. | |
| 2011/0315343 A1* | 12/2011 | Campbell et al. | 165/80.3 |
| 2011/0317367 A1 | 12/2011 | Campbell et al. | |
| 2013/0070420 A1* | 3/2013 | Campbell | H05K 7/20309 361/700 |
| 2013/0077246 A1* | 3/2013 | Campbell | H05K 7/2029 361/700 |
| 2014/0146468 A1* | 5/2014 | Campbell et al. | 361/679.53 |
| 2014/0240918 A1* | 8/2014 | Damaraju | G06F 1/20 361/679.47 |
| 2015/0216079 A1* | 7/2015 | Kondou | F28F 1/40 165/104.21 |

OTHER PUBLICATIONS

Campbell et al., "Pump-Enhanced, Sub-Cooling of Immersion-Cooling Fluid", U.S. Appl. No. 13/671,857, filed Nov. 8, 2012.

Campbell et al., "Pump-Enhanced, Sub-Cooling of Immersion-Cooling Fluid", U.S. Appl. No. 13/780,613, filed Feb. 28, 2013.

* cited by examiner

PUMP-ENHANCED, IMMERSION-COOLING OF ELECTRONIC COMPONENT(S)

BACKGROUND

As is known, operating electronic components produce heat. This heat should be removed in order to maintain device junction temperatures within desirable limits, with failure to remove heat effectively resulting in increased component temperatures, potentially leading to thermal runaway conditions. Several trends in the electronics industry have combined to increase the importance of thermal management, including heat removal for electronic components, including technologies where thermal management has traditionally been less of a concern, such as CMOS. In particular, the need for faster and more densely packed circuits has had a direct impact on the importance of thermal management. First, power dissipation, and therefore heat production, increases as device operating frequencies increase. Second, increased operating frequencies may be possible at lower device junction temperatures. Further, as more and more devices or components are packed onto a single chip, heat flux (Watts/cm$^2$) increases, resulting in the need to remove more power from a given size chip or module. These trends have combined to create applications where it is no longer desirable to remove heat from modern devices solely by traditional air cooling methods, such as by using air cooled heat sinks with heat pipes or vapor chambers. Such air cooling techniques are inherently limited in their ability to extract heat from an electronic component with high power density.

The need to cool current and future high heat load, high heat flux electronic devices therefore mandates the development of aggressive thermal management techniques, using, for instance, liquid cooling.

BRIEF SUMMARY

The shortcomings of the prior art are overcome and additional advantages are provided through, in one aspect, the provision of a cooling apparatus which includes an enclosure, a dielectric fluid, a liquid-cooled heat sink, and a pump. The enclosure includes a compartment which accommodates at least one electronic component to be cooled, and the dielectric fluid within the compartment at least partially immerses the at least one electronic component to be cooled. The liquid-cooled heat sink is associated with the enclosure and cools at least one cooling surface associated with the compartment to facilitate heat transfer to the liquid-cooled heat sink from the electronic component(s) via the dielectric fluid within the compartment. The pump is disposed external to the compartment and is coupled in fluid communication therewith to facilitate pumped dielectric fluid flow through the compartment, which enhances heat transfer from the electronic component(s) to the liquid-cooled heat sink via the cooling surface(s).

In another aspect, a cooled electronic assembly is provided which includes at least one electronic component and a cooling apparatus. The cooling apparatus includes an enclosure, a dielectric fluid, a liquid-cooled heat sink, and at least one pump. The enclosure includes a compartment which accommodates the at least one electronic component to be cooled, and dielectric fluid within the compartment at least partially immerses the at least one electronic component to be cooled. The liquid-cooled heat sink is associated with the enclosure and cools at least one cooling surface associated with the compartment to facilitate heat transfer to the liquid-cooled heat sink from the at least one electronic component(s) via the dielectric fluid within the compartment. The pump is disposed external to the compartment and is coupled in fluid communication therewith to facilitate pumped dielectric fluid flow through the compartment, which enhances heat transfer from the electronic component(s) to the liquid-cooled heat sink via the cooling surface(s).

In a further aspect, a method is provided which includes fabricating a cooling apparatus to facilitate cooling at least one electronic component. Fabricating the cooling apparatus includes: providing an enclosure comprising a compartment accommodating the at least one electronic component to be cooled; providing a dielectric fluid within the compartment at least partially immersing the at least one electronic component; associating a liquid-cooled heat sink with the enclosure to cool at least one cooling surface associated with the compartment, the at least one cooling surface facilitating heat transfer to the liquid-cooled heat sink from the at least one electronic component via the dielectric fluid within the compartment; and providing a pump disposed external to the compartment and coupled in fluid communication therewith to facilitate pumped dielectric fluid flow through the compartment, the pumped dielectric fluid flow through the compartment enhancing heat transfer from the at least one electronic component to the liquid-cooled heat sink via the at least one cooling surface.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1:
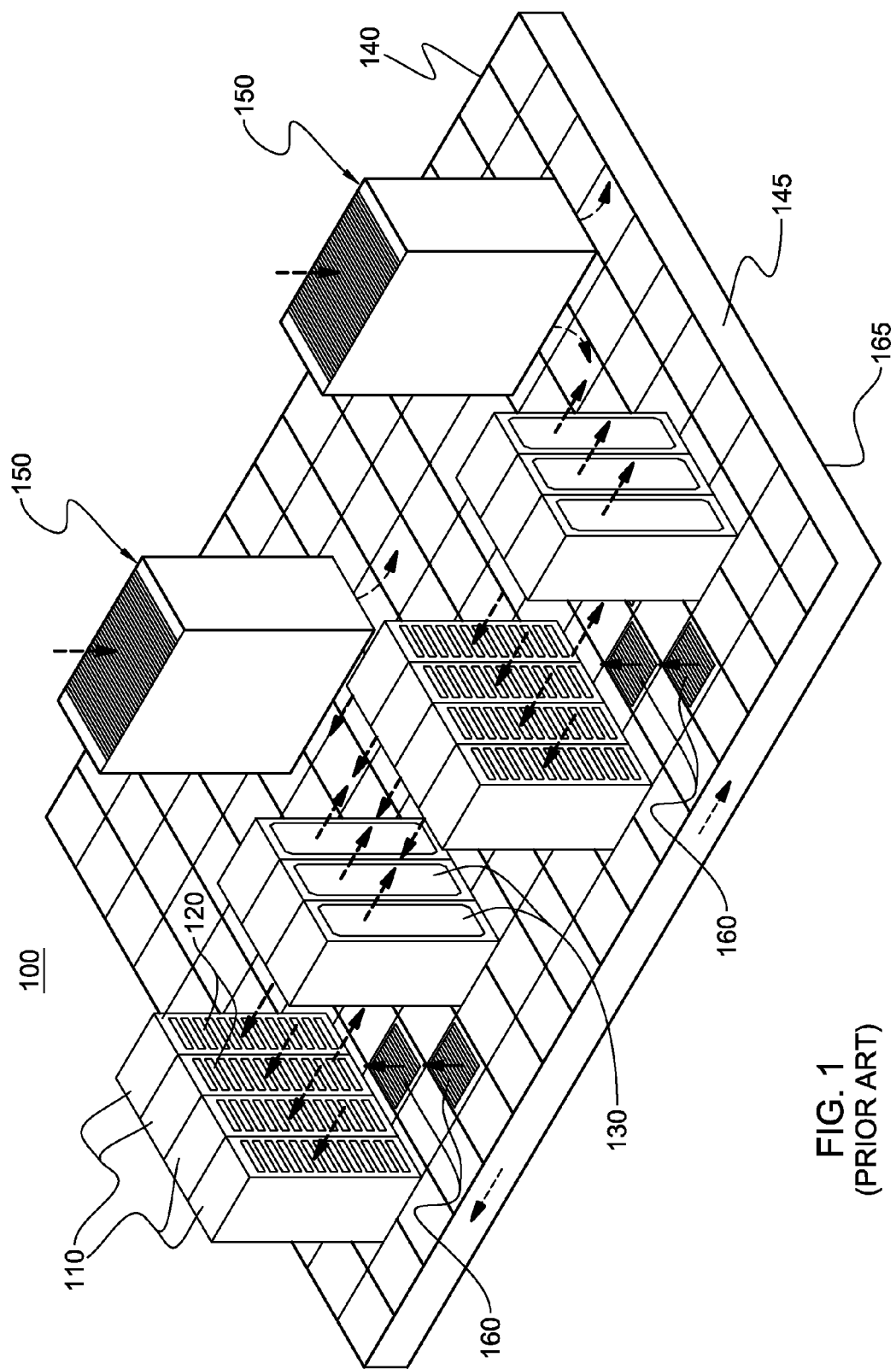
FIG. 1. depicts one embodiment of a conventional raised floor layout of an air-cooled data center.

Aspects of the present invention and certain features, advantages, at details thereof, are explained more fully below with reference to the non-limiting embodiments illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating embodiments of the invention, are given by way of illustration only, and unless otherwise specified, are not by way of limitation. Various substitutions, modifications, additions and/or arrangements within the spirit and/or scope of the underlying inventive concepts will be apparent to those skilled in the art from this disclosure.

As used herein, the terms "electronics rack" and "rack unit" are used interchangeably, and unless otherwise specified include any housing, frame, rack, compartment, blade server system, etc., having one or more heat-generating components of a computer system, electronic system, or information technology equipment, and may be, for example, a stand-alone computer processor having high-, mid- or low-end processing capability. In one embodiment, an electronics rack may comprise a portion of an electronic system, a single electronic system, or multiple electronic systems, for example, in one or more sub-housings, blades, books, drawers, nodes, compartments, etc., having one or more heat-generating electronic components disposed therein. An electronic system(s) within an electronics rack may be movable or fixed relative to the electronics rack, with rack-mounted electronic drawers and blades of a blade-center system being two examples of electronic systems (e.g., subsystems or nodes) of an electronics rack to be cooled.

"Electronic component" refers to any heat generating electronic component of, for example, an electronic system or other unit requiring cooling. By way of example, an electronic component may comprise one or more integrated circuit dies and/or other electronic devices to be cooled, including one or more processor dies, memory dies or memory support dies. As a further example, the electronic component may comprise one or more bare dies or one or more packaged dies disposed on a common carrier. Further, unless otherwise specified herein, the terms "liquid-cooled heat sink", or "liquid-cooled structure" each refer to any conventional thermally conductive structure having a plurality of channels or passageways formed therein for flowing of liquid-coolant therethrough.

As used herein, a "liquid-to-liquid heat exchanger" may comprise, for example, two or more coolant flow paths, formed of thermally conductive tubing (such as copper or other tubing) in thermal or mechanical contact with each other. Size, configuration and construction of the liquid-to-liquid heat exchanger can vary without departing from the scope of the invention disclosed herein. Further, "data center" refers to a computer installation containing, for example, one or more electronics racks to be cooled. As a specific example, a data center may include one or more rows of rack-mounted computing units, such as server units.

One example of facility coolant and system coolant is water. However, the concepts disclosed herein are readily adapted to use with other types of coolant on the facility side and/or on the system side. For example, one or more of these coolants may comprise a brine, a dielectric liquid, a fluorocarbon liquid, a liquid metal, or other similar coolant, or refrigerant, while still maintaining the advantages and unique features of the present invention.

Reference is made below to the drawings, which are not drawn to scale for ease of understanding, wherein the same reference numbers used throughout different figures designate the same or similar components.

FIG. 1 depicts a raised floor layout of an air cooled data center 100 typical in the prior art, wherein multiple electronics racks 110 are disposed in one or more rows. A data center such as depicted in FIG. 1 may house several hundred, or even several thousand microprocessors. In the arrangement illustrated, chilled air enters the computer room via perforated floor tiles 160 from a supply air plenum 145 defined between the raised floor 140 and a base or sub-floor 165 of the room. Cooled air is taken in through louvered covers at air inlet sides 120 of the electronics racks and expelled through the backs, that is, air outlet sides 130, of the electronics racks. Each electronics rack 110 may have one or more air moving devices (e.g., fans or blowers) to provide forced inlet-to-outlet airflow to cool the electronic devices within the subsystem(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within data center 100. Room air is taken into each air conditioning unit 150 near an upper portion thereof. This room air may comprise in part exhausted air from the "hot" aisles of the computer installation defined, for example, by opposing air outlet sides 130 of electronics racks 110.

Figure 2:
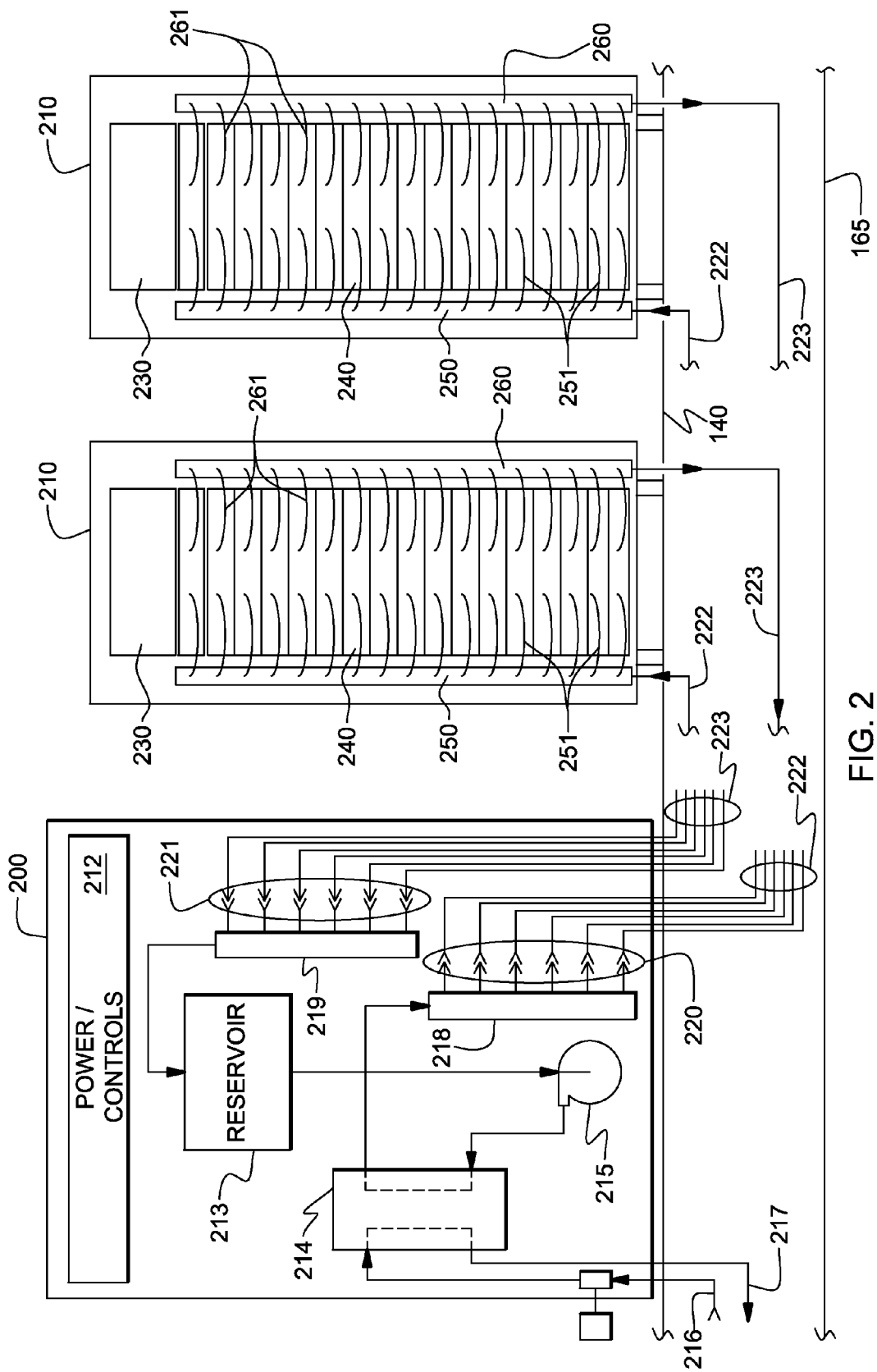
FIG. 2 depicts one embodiment of an at least partially liquid-cooled data center which includes a coolant distribution unit facilitating liquid-cooling of electronics racks of the data center, in accordance with one or more aspects of the present invention.
Figure 3:
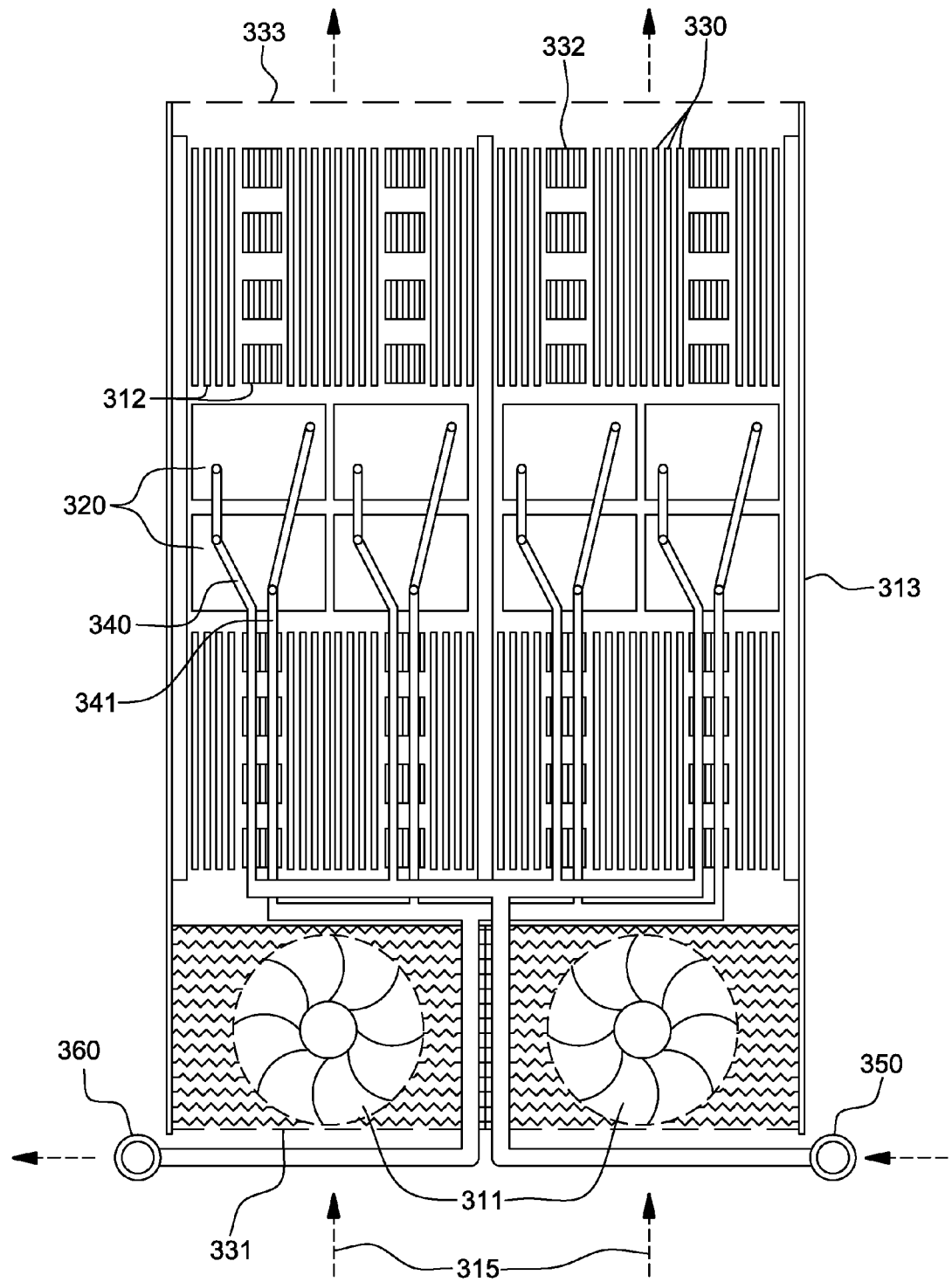
FIG. 3 is a plan view of one embodiment of an electronic system (e.g., subsystem or node) layout, illustrating an air and liquid-cooling apparatus for cooling components of the electronic system, in accordance with one or more aspects of the present invention.

Due to the ever-increasing airflow requirements through electronics racks, and the limits of air distribution within the typical data center installation, liquid-based cooling is being combined with the above-described conventional air-cooling. FIGS. 2-3 illustrate one embodiment of a data center implementation employing a hybrid air- and liquid-based cooling system with one or more liquid-cooled heat sinks or cold plates coupled to high heat-generating electronic components disposed within the electronics racks.

FIG. 2 depicts one embodiment of an at least partially liquid-cooled data center which includes a coolant distribution unit 200 having a power/control element 212, a reservoir/expansion tank 213, a heat exchanger 214, a pump 215 (possibly accompanied by a redundant second pump), facility water inlet 216 and outlet 217 supply pipes, a supply manifold 218 supplying water or system coolant to the electronics racks 210 via couplings 220 and lines 222, and a return manifold 219 receiving water from the electronics racks 210, via lines 223 and couplings 221. Each electronics rack includes (in one example) a power/control unit 230 for the electronics rack, multiple electronic systems 240, a system coolant supply manifold 250, and a system coolant return manifold 260. In this embodiment, each electronics rack 210 is disposed on raised floor 140 of the data center, with lines 222 providing system coolant to system coolant supply manifolds 250 and lines 223 facilitating return of system coolant from system coolant return manifolds 260 shown disposed in the supply air plenum beneath the raised floor.

In the embodiment illustrated, the system coolant supply manifold 250 provides system coolant to the cooling systems of the electronic systems (more particularly, for example, to liquid-cooled cold plates thereof) via flexible hose connections 251, which are disposed between the supply manifold and the respective electronic systems within the rack. Similarly, system coolant return manifold 260 is coupled to the electronic subsystems via flexible hose connections 261. Quick connect couplings may be employed at the interface between flexible hoses 251, 261 and the individual electronic systems. By way of example, these quick connect couplings may comprise various types of commercially available couplings, such as those available from Colder Products Company, of St. Paul, Minn., USA, or Parker Hannifin, of Cleveland, Ohio, USA.

Although not shown, electronics rack 210 may also include an air-to-liquid heat exchanger disposed at an air outlet side thereof, which also receives system coolant from the system coolant supply manifold 250 and returns system coolant to the system coolant return manifold 260.

FIG. 3 depicts one embodiment of an electronic system 313 component layout wherein one or more air moving devices 311 provide forced air flow 315 to cool multiple components 312 within electronic system 313. Cool air is taken in through a front 331 and exhausted out a back 333 of the system. The multiple components to be cooled include multiple processor modules to which liquid-cooled cold plates 320 (of a liquid-based cooling system) are coupled, as well as multiple arrays of memory modules 330 (e.g., dual in-line memory modules (DIMMs)) and multiple rows of memory support modules 332 (e.g., DIMM control modules) to which air-cooled heat sinks are coupled. In the embodiment illustrated, memory modules 330 and the memory support modules 332 are partially arrayed near front 331 of electronic system 313, and partially arrayed near back 333 of electronic system 313. Also, in the embodiment of FIG. 3, memory modules 330 and the memory support modules 332 are cooled by air flow 315 across the electronic system.

The illustrated liquid-based cooling system further includes multiple coolant-carrying tubes 340, 341 connected to and in fluid communication with liquid-cooled cold plates 320. The coolant-carrying tubes 340, 341 comprise coolant supply tubes 340 and coolant return tubes 341, which are respectively in fluid communication with a system coolant supply manifold 350 and a system coolant return manifold 360. In this manner, system coolant is circulated through electronic system 313, and in particular, liquid-cooled cold plates 320 thereof, to facilitate removal of heat from high-heat-generating components of the electronic system, such as processor modules disposed within the system.

As computing demands continue to increase, heat dissipation requirements of electronic components, such as microprocessors and memory modules, are also rising. This has motivated the development of single-phase, liquid-cooling solutions such as described above. Single-phase, liquid-cooling, however, has some issues. Sensible heating of the liquid as it flows along the cooling channels and across components connected in series results in a temperature gradient. To maintain a more uniform temperature across the heat-generating component, the temperature change in the liquid needs to be minimized. This requires the liquid to be pumped at higher flow rates, consuming more pump power, and thus leading to a less efficient system. Further, it is becoming increasingly challenging to cool all the heat sources on a server or electronic system using indirect pumped liquid, due to the density and number of components, such as controller chips, I/O components and memory modules. The small spaces and number of components to be cooled by the cold plate(s) may make liquid plumbing a complex design and fabrication problem and raise the overall cost of the cooling solution.

Immersion-cooling is one possible solution to these issues. In immersion-cooling, one or more components to be cooled are immersed in a dielectric fluid that dissipates heat through boiling. The vapor is then condensed by a secondary, rack-level working fluid using module-level vapor condensers, as explained below.

Direct immersion-cooling of one or more electronic components of an electronic system of a rack unit using a working fluid (e.g., a dielectric fluid liquid) advantageously avoids forced air cooling and enables greater liquid-cooling of the electronics rack within the data center. Although indirect liquid-cooling, such as described above in connection with FIGS. 2 & 3, has certain advantages due to the low cost and wide availability of water as a coolant, as well as its superior thermal and hydraulic properties, where possible and viable, the use of dielectric fluid immersion-cooling in combination therewith may offer several unique benefits.

For example, the use of a dielectric fluid that condenses at a temperature above typical outdoor ambient air temperature would enable data center cooling architectures which do not require energy intensive refrigeration chillers. Yet other practical advantages, such as the ability to ship a coolant filled electronic system, may offer benefit over water-cooled approaches such as depicted in FIGS. 2 & 3, which require shipping dry and the use of a fill and drain protocol to insure against freeze damage during transport. Also, the use of liquid immersion-cooling may, in certain cases, allow for greater compaction of electronic components at the electronic system level and/or electronic rack level since conductive cooling structures might be eliminated. Unlike corrosion sensitive water-cooled systems, chemically inert dielectric fluid (employed in an immersion-cooling approach such as described herein) would not mandate copper as the primary thermally conductive wetted metal. Lower cost and lower mass aluminum structures could replace copper structures wherever thermally viable, and the mixed wetted metal assemblies would not be vulnerable to galvanic corrosion, such as in the case of a water-based cooling approach. For at least these potential benefits, dielectric fluid immersion-cooling of one or more electronic components or electronic systems (e.g., of an electronics rack) may offer significant energy efficiency and higher performance cooling benefits, compared with currently available hybrid air and indirect water cooled systems.

In the examples discussed below, the dielectric fluid may comprise any one of a variety of commercially available dielectric coolants. For example, any of the Fluorinert™ or Novec™ fluids manufactured by 3M Corporation (e.g., FC-72, FC-86, HFE-7000, and HFE-7200) could be employed. Alternatively, a refrigerant such as R-134a or R-245fa may be employed if desired.

Figure 4:
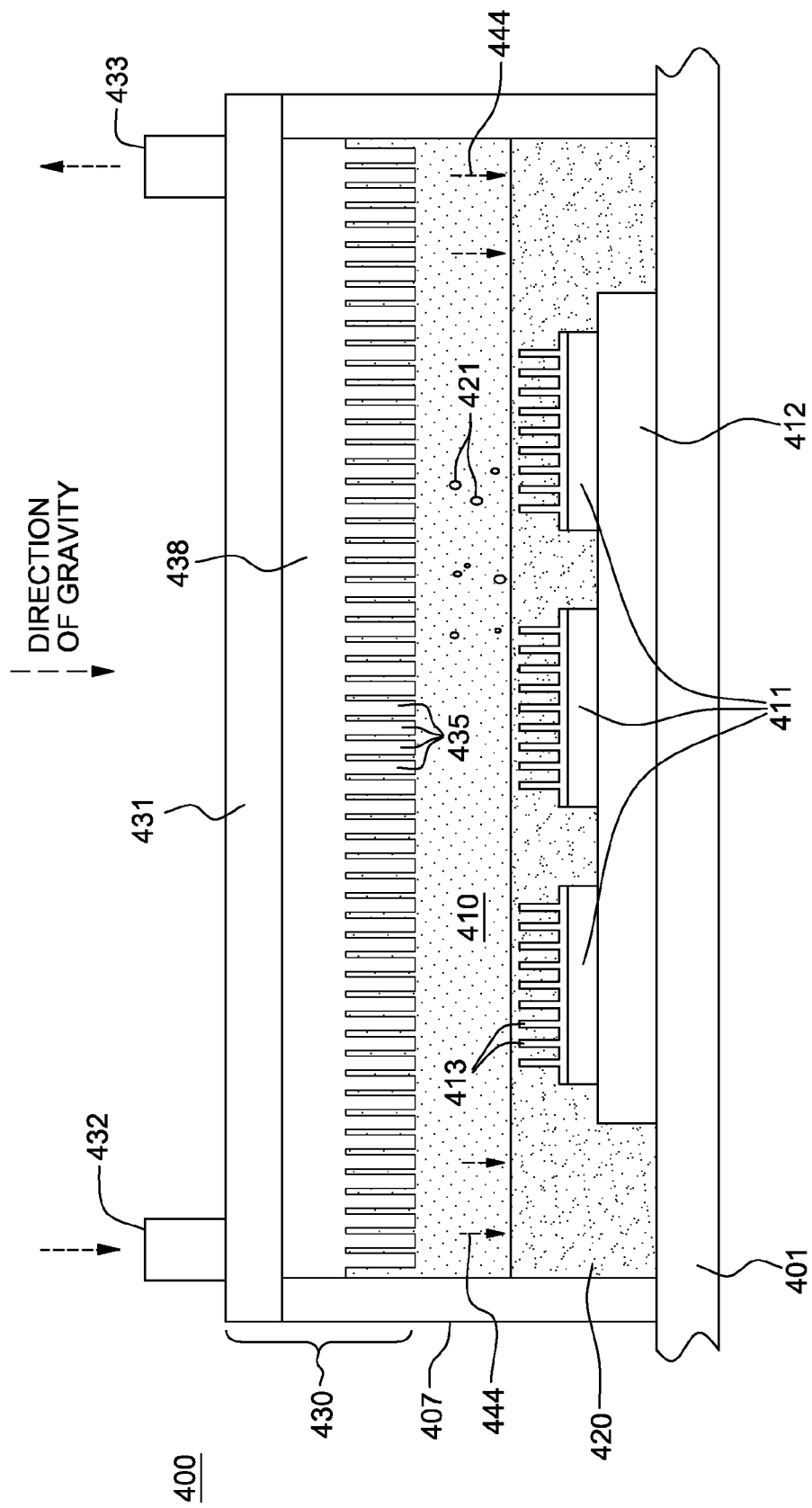
FIG. 4 depicts one embodiment of a cooled electronic system comprising one or more electronic components to be cooled and a cooling apparatus, in accordance with one or more aspects of the present invention.

FIG. 4 depicts one embodiment of a cooled electronic system 400 comprising a cooling apparatus, in accordance with one or more aspects of the present invention. Cooled electronic system 400 is, by way of example, an immersion-cooled electronic module, wherein multiple electronic components 411, such as electronic chips or packages, are coupled to a printed circuit board 401 through a chip carrier or substrate 412. The electronic components 411 include, for instance, a plurality of thermally conductive, extended surfaces 413, which facilitate heat transfer and boiling of working fluid 420 within the illustrated compartment 410, within which the electronic components reside. Compartment 410 is defined (at least in part) by an enclosure (or casing) 407 which, in one embodiment, is mechanically coupled via a securing mechanism (not shown) to printed circuit board 401. In this embodiment, compartment 410 is a sealed compartment, and working fluid 420, such as a dielectric fluid, partially fills the compartment 410. Note that as used herein, and unless otherwise indicated, the word "substrate" refers to any underlying supporting structure, such as substrate 412 or printed circuit board 401, to which the electronic components are coupled, and to which the enclosure may be sealed in order to form a fluid-tight compartment 410 about the electronic components.

As depicted, the cooled electronic system 400 further includes a liquid-cooled heat sink 430, which comprises (by way of example only) a liquid-cooled cold plate 431 configured to allow a coolant, such as water, to flow therethrough. In this example, a coolant supply inlet 432 and coolant return outlet 433 are coupled in fluid communication with one or more coolant-carrying channels (not shown) within liquid-cooled cold plate 431 for convectively removing heat to the coolant (e.g., water) from a thermally conductive cover plate 438 of the system. Further, in this example, thermally conductive cover plate 438 includes a plurality of thermally conductive condenser fins 435, which facilitate condensing of dielectric fluid vapor rising into the upper region of the compartment 410.

When in operation, as dielectric fluid absorbs heat, it undergoes phase change from liquid phase to vapor phase, and thus utilizes its latent heat of vaporization for cooling purposes. The resultant dielectric fluid vapor rises to the upper region of the compartment, and the fluid vapor contacts the cool surfaces of the condenser fins 435 in the condensing region. As noted, the condensing fins are cooled by means of a thermal conduction coupling to liquid-cooled cold plate 431, and further by convection to coolant (such as water) passing through the liquid-cooled cold plate 431. By making contact with the cool condenser fins surfaces, the dielectric fluid vapor undergoes a second phase change process from vapor to liquid state, and the liquid droplets 421 fall downwards 444 due to gravity and their relatively higher density compared with the neighboring vapor region. By way of example, the condenser fins 435 might comprise pin fin or plate fin structures. Further, depending on the implementation, the vertical length of the condenser fins may vary with, for instance, more centrally-disposed condenser fins being longer than the condenser fins disposed closer to the perimeter.

Disclosed hereinbelow with reference to FIGS. 5A-6D are various alternate embodiments of a cooling apparatus and cooled electronic system which provide at least partial immersion-cooling of electronic components using pumped dielectric fluid flow and an in-system or in-node flow loop dedicated to one or more cooled electronic assemblies containing the electronic component(s) to be cooled. In these implementations, the pumps are assembly-level or module-level fluid pumps, or alternatively, node-level fluid pumps. By way of example, FIGS. 5A-6D present various configurations of the cooled electronic systems which comprise a cooling apparatus with pumped immersion-cooled dielectric fluid flow, a flow loop within the electronic system, and a liquid-cooled heat sink, such as a water-cooled heat sink, at the assembly or node level inside of the electronic system, in various locations and modularity configurations. In one implementation, two-phase, pumped immersion-cooling of the electronic components is discussed.

Generally stated, disclosed herein are a cooled electronic system and a cooling apparatus. The cooled electronic system includes at least one electronic component to be cooled, and the cooling apparatus. The cooling apparatus includes an enclosure comprising a compartment accommodating the at least one electronic component to be cooled, and dielectric fluid within the compartment at least partially immersing the at least one electronic component. A liquid-cooled heat sink is associated with the enclosure and cools at least one cooling surface associated with the compartment. The at least one cooling surface facilitates heat transfer to the liquid-cooled heat sink from the at least one electronic component via the dielectric fluid within the compartment. The apparatus further includes one or more pumps disposed external to the compartment and coupled in fluid communication therewith to facilitate pumped dielectric fluid flow through the compartment, which enhances heat transfer from the at least one electronic component to the liquid-cooled heat sink via the at least one cooling surface.

In one implementation, the pumped dielectric fluid flow provides single-phase cooling of the electronic component(s), while in another implementation, the pumped dielectric fluid flow provides two-phase cooling of the electronic component(s). In a two-phase cooling embodiment, the cooling surface(s) is at least one vapor-condensing surface in thermal communication with the liquid-cooled heat sink. In this implementation, the vapor-condensing surface may comprise a plurality of condenser fins disposed in an upper region of the compartment, and in one embodiment, the pumped dielectric fluid flow may at least partially immerse the plurality of condenser fins.

As described below, in one embodiment, a baffle may be disposed within the compartment to direct pumped dielectric fluid flow first across the electronic component(s), and then across the plurality of condenser fins downstream of the at least one electronic component. In this implementation, the plurality of condenser fins may engage and even extend through the baffle, to increase the extent that the pumped dielectric flow is in contact with the plurality of condenser fins.

In another implementation, either in combination with the baffle implementation, or separate, the cooled electronic assembly of the cooled electronic system may include a plurality of dielectric fluid boiling fins coupled to the at least one electronic component to facilitate heat transfer via flow boiling from the at least one electronic component to the pumped dielectric fluid flow. The plurality of dielectric fluid boiling fins function as extended boiling surfaces in thermal communication with the electronic component(s). In certain configurations, the plurality of dielectric fluid boiling fins may extend in between (e.g., be, at least partially, interleaved with) the plurality of condenser fins.

In one implementation, the one or more pumps of the cooling apparatus may draw, via a return tube, single-phase liquid dielectric fluid from the compartment, and provide, via a supply tube, single-phase liquid dielectric fluid to the compartment to facilitate pumped dielectric fluid flow through the compartment. In another embodiment, the liquid-cooled heat sink may be disposed over the compartment, and the pump disposed over the liquid-cooled heat sink. Further, the pump may facilitate dielectric fluid flow through the respective enclosure, as well as through at least one other enclosure comprising at least one other compartment accommodating at least one other electronic component immersion-cooled by dielectric fluid; that is, a single pump could facilitate pumped dielectric fluid flow through multiple series and/or parallel-coupled, cooled electronic assemblies such as disclosed herein.

In another implementation of a cooled electronic system, a plurality of cooled electronic assemblies may be provided, each with a compartment accommodating one or more electronic components at least partially immersed within dielectric fluid. Pumped dielectric fluid flow through the plurality of compartments is achieved via one or more node-level pumps coupled to the plurality of compartments via parallel and/or series-coupled dielectric fluid flow tubing. In this implementation, a node-level, liquid-to-liquid heat exchanger may be provided within the electronic system coupled to the dielectric fluid flow loop(s) to reject heat from dielectric fluid egressing from the compartments of the assemblies to liquid coolant supplied to the electronic system, for instance, via a coolant distribution unit such as described above in connection with FIGS. 2 & 3.

Figure 5A:
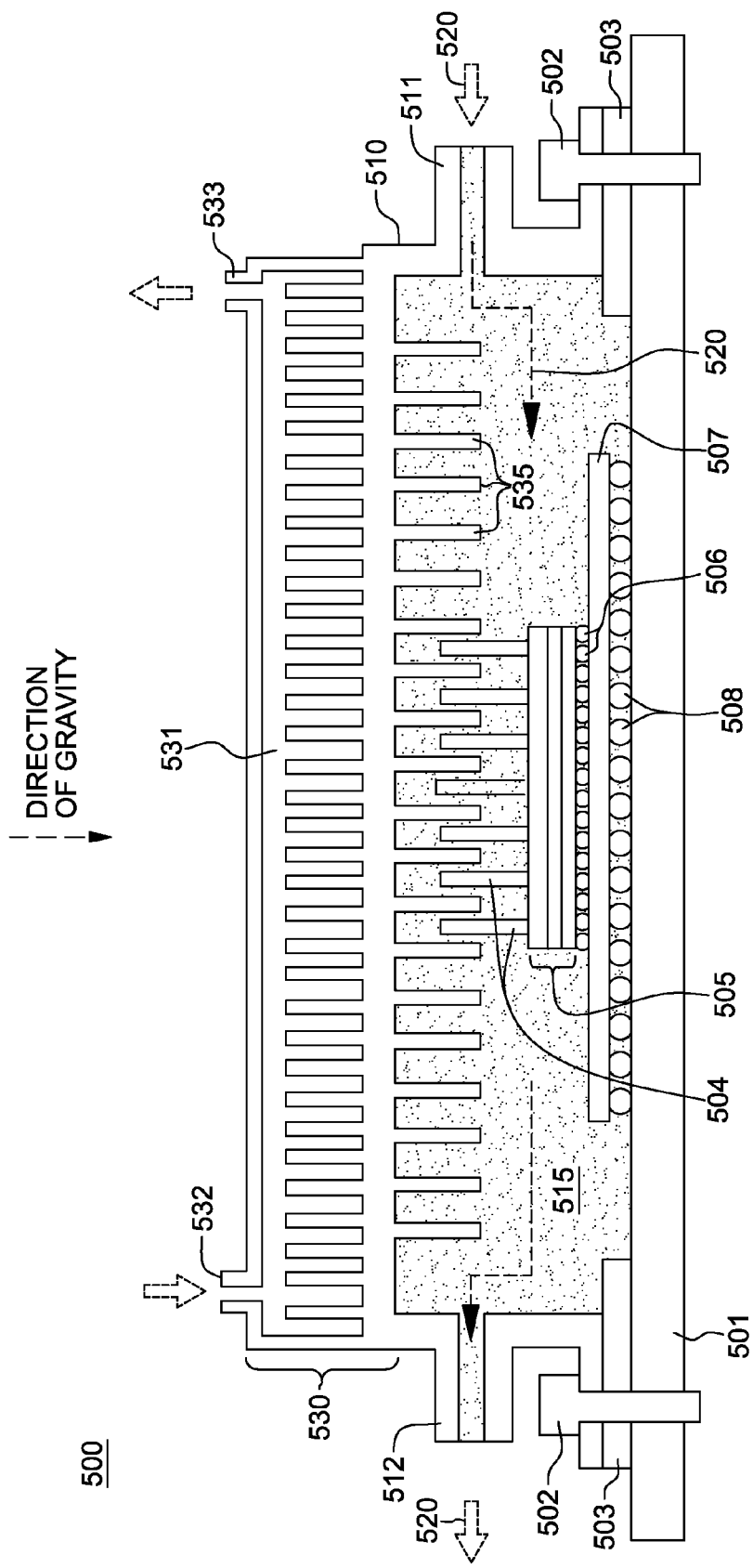
FIG. 5A is a partial depiction of another embodiment of a cooled electronic system comprising one or more electronic components to be cooled and a cooling apparatus, in accordance with one or more aspects of the present invention.
Figure 5B:
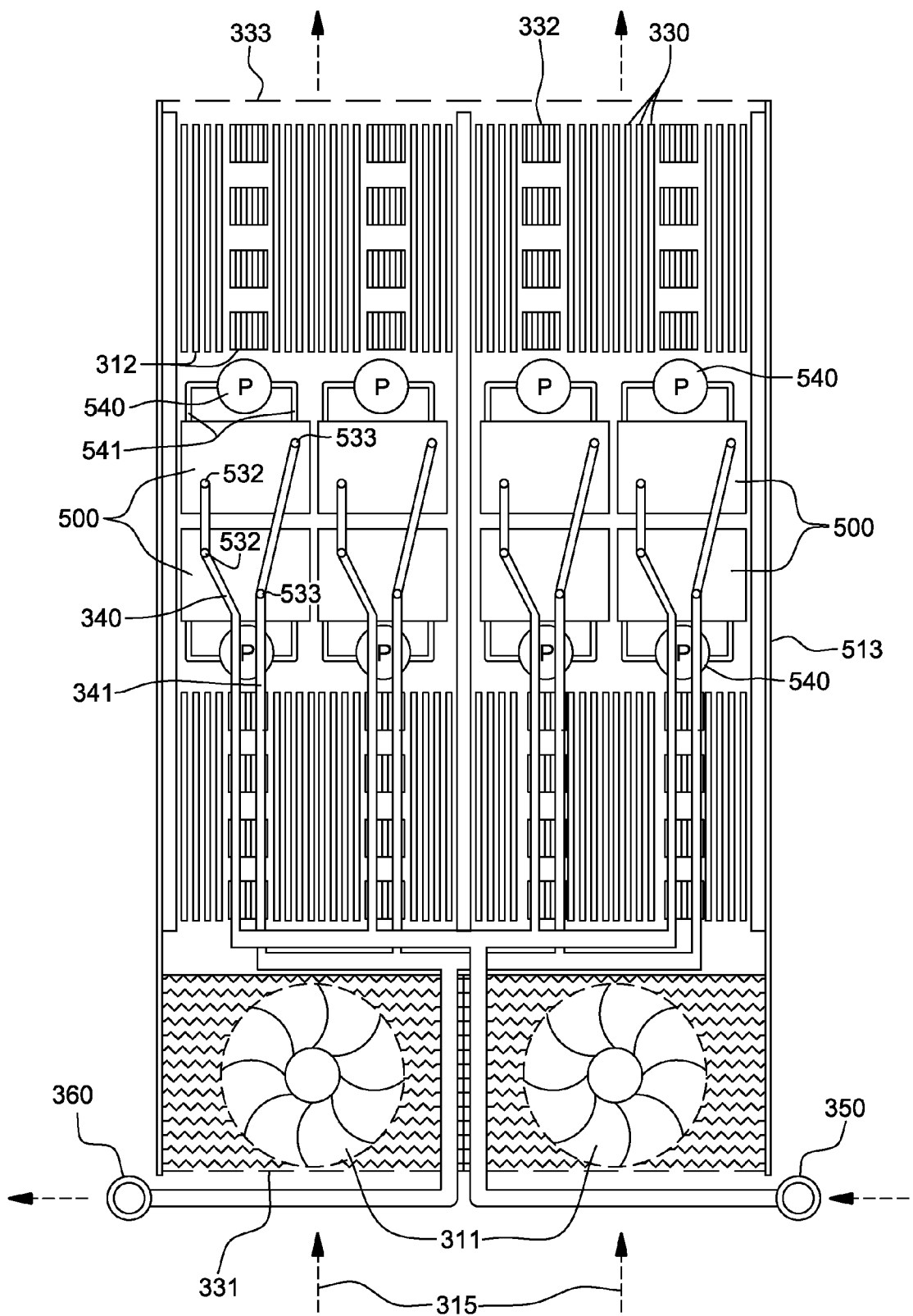
FIG. 5B is a plan view of one embodiment of a cooled electronic system (e.g., subsystem or node) layout, illustrating air and liquid-cooling of system components employing, at least in part, multiple cooled electronic assemblies such as depicted in FIG. 5A, in accordance with one or more aspects of the present invention.

FIGS. 5A & 5B depict one embodiment of a cooled electronic system, in accordance with one or more aspects of the present invention. Referring collectively to FIGS. 5A & 5B, a cooled electronic system 513 (FIG. 5B) is presented, wherein one or more air-moving devices 311 provides forced airflow 315 to cool multiple components 312 within cooled electronic system 513. Cool air is taken in through front 331 and exhausted out back 333 of the system. The multiple components to be cooled include multiple electronic components, such as multiple processor modules disposed within cooled electronic assemblies 500 (of a liquid-based cooling system), as well as multiple arrays of memory modules 330 (e.g., dual in-line memory modules (DIMMs)) and multiple rows of memory support modules 332 (e.g., DIMM control modules), to which air-cooled heat sinks may be coupled. In the embodiment illustrated, memory modules 330 and memory support modules 332 are partially arrayed near front 331 of cooled electronic system 513, and partially arrayed near back 333 of cooled electronic system 513. Also, in the embodiment of FIG. 5B, memory modules 330 and memory support modules 332 are cooled by airflow 315 across the electronic system.

The illustrated liquid-based cooling system or cooling apparatus includes multiple coolant-carrying tubes 340, 341 connected to and in fluid communication with multiple cooled electronic assemblies 500. The coolant-carrying tubes 340, 341 include coolant supply tubes 340 and coolant return tubes 341, which are respectively in fluid communication with a system coolant supply manifold 350 and a system coolant return manifold 360. In this manner, system coolant, such as water, may be circulated through the cooled electronic system 513, and in particular, liquid-cooled heat sinks or cold plates of the cooled electronic assemblies 500 thereof, to facilitate removal of heat from, for instance, high-heat-generating components of the electronic system, such as processor modules disposed within the system.

As illustrated in FIG. 5B, the cooled electronic assemblies 500 include dielectric fluid pumps 540 in fluid communication therewith via respective dielectric fluid flow tubes 541. In this implementation, each dielectric fluid pump 540 is dedicated to a respective cooled electronic assembly 500 of the cooled electronic system.

As illustrated in FIGS. 5A & 5B, the cooled electronic assemblies 500 include a liquid-cooled heat sink 530 associated with an enclosure 510 defining a compartment 515 about the one or more electronic components 505 to be cooled. A coolant supply inlet 532 and coolant supply outlet 533 are coupled in fluid communication with the respective coolant-carrying tubes 340, 341, as illustrated in FIG. 5B.

FIG. 5A depicts one configuration of a cooled electronic assembly 500, wherein the one or more electronic components 505 are electrically connected 506 to a substrate 507, which is electrically connected 508 to a printed circuit board 501. In one implementation, electronic component(s) 505 comprises a three-dimensional component (e.g., three-dimensional chip or module) to be cooled. This component has, in one embodiment, a plurality of dielectric fluid boiling fins 504 coupled thereto or in thermal communication therewith. Compartment 515 is formed by enclosure 510 being coupled via mechanical fasteners 502 and fluid-tight seal(s) 503 to printed circuit board 501 (in one implementation). Enclosure 510 is configured with a dielectric fluid inlet 511 and a dielectric fluid outlet 512 which allow for pumped (i.e., forced) dielectric fluid flow through compartment 515 of the enclosure.

In the embodiment depicted, liquid-cooled heat sink 530 comprises, by way of example, a liquid-cooled cold plate with one or more coolant-carrying channels 531 therein, through which liquid coolant, such as water or an aqueous-based solution, is circulated. One or more cooling surfaces 535 of the liquid-cooled heat sink 530 or of a structure in thermal communication with the liquid-cooled heat sink are associated with (e.g., reside within or are exposed within) the compartment 515. In one embodiment, the cooling surface(s) 535 is formed integral with the liquid-cooled heat sink, and in another embodiment, is coupled in thermal communication therewith, to facilitate heat transfer to the liquid-cooled heat sink from the one or more electronic components 505 via the pumped dielectric fluid flow 520 within compartment 515. Note that in the depicted embodiment, the one or more cooling surfaces 535 comprise a plurality of thermally conductive fins extending into compartment 515 in an upper region of the compartment 515.

In one implementation, the plurality of dielectric fluid boiling fins 504 are at least partially disposed in between or are interleaved with at least some of the plurality of thermally conductive fins. In a single-phase dielectric fluid embodiment, dielectric fluid 520 may substantially fill compartment 515, while in a two-phase embodiment, dielectric fluid 520 may only partially fill compartment 515 with a vapor region (not shown) being disposed in an upper portion of the compartment containing the plurality of thermally conductive fins. In this implementation, the plurality of thermally conductive fins function, at least in part, as a plurality of vapor-condensing fins, and fluid boiling heat transfer from the electronic component(s) 505 to the liquid-cooled heat sink 530 is similar to that described above in connection with the cooled electronic system embodiment of FIG. 4.

Depending on the characteristics desired, the plurality of dielectric fluid boiling fins 504 may comprise a plurality of thermally conductive pin fins, a plurality of thermally conductive plate fins, etc., which provide enhanced heat transfer area to transfer heat from the electronic component(s) (e.g., integrated circuit chip(s)) to the flowing dielectric fluid within which the electronic component(s) is at least partially immersed. In the two-phase implementation, the dielectric fluid boils and absorbs heat, with the rising dielectric fluid vapor being condensed within the compartment itself via contact with the plurality of vapor-condensing fins (i.e., the one or more cooling surfaces 535) disposed within the compartment. The condenser fins are in thermal communication with the liquid-cooled heat sink or cold plate, and the liquid-cooled heat sink can be formed integral with the enclosure of the cooled electronic assembly, or as a detachable component coupled to the enclosure, for instance, on top of the enclosure or assembly, using a thermal interface material. As noted, in one implementation, the dielectric fluid boiling fins 504 may be interspersed with the array of condenser fins to facilitate local in situ vapor condensation. Thus, the dielectric fluid enters the compartment as single-phase dielectric fluid liquid, boils within the compartment to facilitate extracting the electronic component(s) heat load, condenses within the compartment itself, and leaves the compartment as single-phase dielectric fluid liquid 520. An external pump 540 (FIG. 5B) is employed to circulate the dielectric fluid through the compartment. In the implementation of FIG. 5B, the dielectric fluid pumps 540 are depicted at the sides of their respective cooled electronic assemblies 500 (by way of example).

Figure 5C:
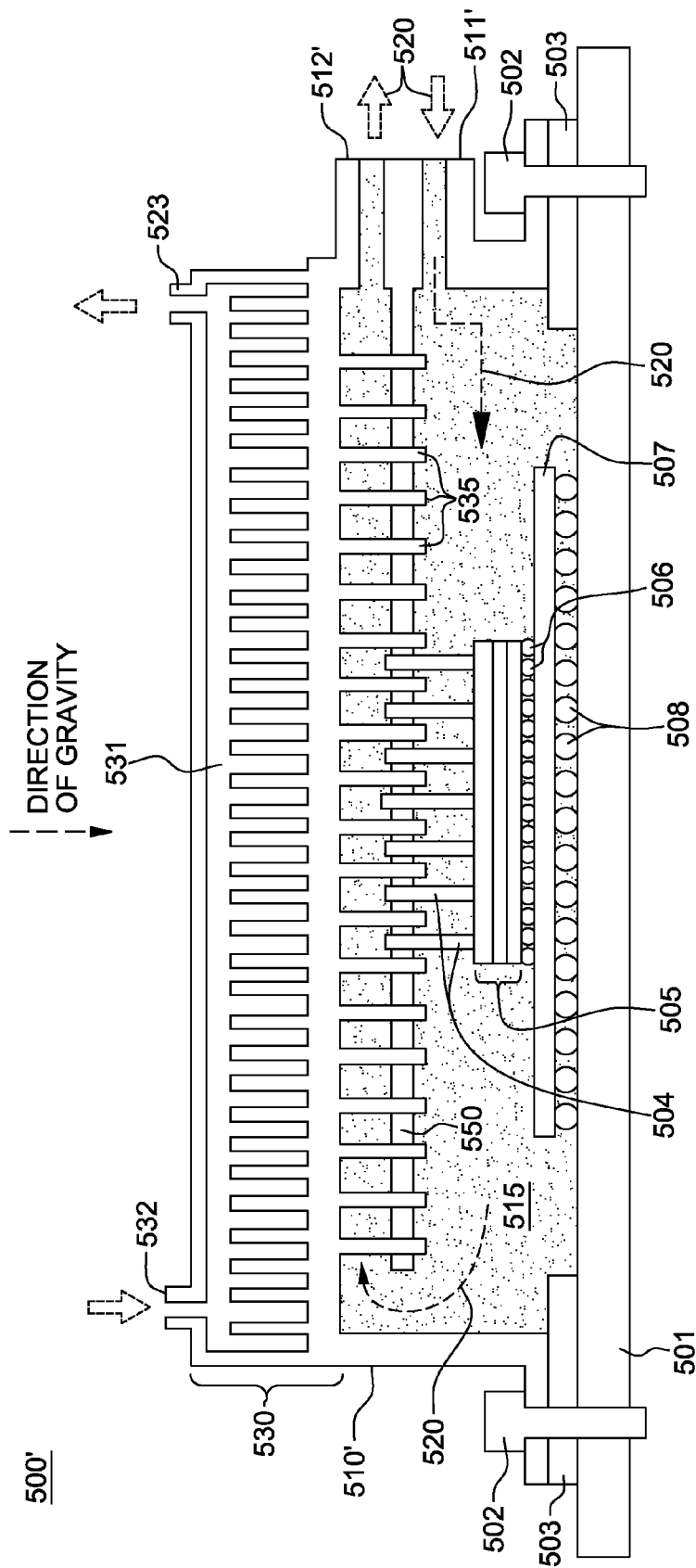
FIG. 5C depicts a further embodiment of the cooled electronic assembly of FIG. 5A, and comprising one or more electronic components to be cooled using a cooled electronic system, in accordance with one or more aspects of the present invention.

FIG. 5C depicts an alternate embodiment of a cooled electronic assembly 500', similar to cooled electronic assembly 500 described above in connection with FIG. 5A. In this embodiment, however, a baffle 550 is provided to direct pumped dielectric fluid flow 520 across the electronic component(s) 505, and if present, at least a portion of the dielectric fluid boiling fins 504, before turning and passing the pumped dielectric fluid across the plurality of cooling surfaces or condenser fins 535. Note that in this embodiment, dielectric fluid 520 enters via a dielectric fluid inlet 511' and exits via a dielectric fluid outlet 512' disposed on a common side of enclosure 510' of the electronic assembly. Also note that, in the depicted embodiment, the plurality of dielectric fluid boiling fins 504 and the plurality of cooling surfaces 535 or condenser fins may extend into or even through baffle 550. In one implementation, baffle 550 is fabricated of a thermally conductive material, and the interleaving of the plurality of dielectric fluid boiling fins 504 and plurality of cooling surfaces 535 within baffle 550 further facilitates heat transfer between the electronic component(s) and the liquid-cooled heat sink 530.

Note that this dual pass design of FIG. 5C may be used in either a single-phase dielectric fluid implementation, or a two-phase dielectric fluid implementation, such as described above in connection with the embodiment of FIG. 5A. In a two-phase dielectric fluid implementation, partially boiled dielectric fluid (e.g., a two-phase mixture) is forced to turn 180°, and pass again through the plurality of condenser fins, thus allowing additional time for the dielectric fluid vapor to condense to fully complete the condensation process so that dielectric fluid liquid 520 leaves through dielectric fluid outlet 512' from the cooled electronic assembly 500'. For instance, the implementation of FIG. 5C may be desirable should the heat load be large, with significant dielectric fluid vapor being generated, requiring a considerable amount of vapor condensation.

As with the cooled electronic assembly 500 of FIG. 5A, depending on the characteristics desired, the plurality of dielectric fluid boiling fins 504 may comprise a plurality of thermally conductive pin fins, a plurality of thermally conductive plate fins, etc., which provide enhanced heat transfer area to transfer heat from the electronic component(s) 505 to the flowing dielectric fluid 520. If a plurality of thermally conductive plate fins is employed, then the plate fins are aligned to facilitate flow of the pumped dielectric fluid through compartment 515. In the two-phase implementation, the dielectric fluid boils and absorbs heat, with the rising dielectric fluid vapor being condensed within the compartment itself via contact with the plurality of thermally conductive fins, which in the embodiment depicted in FIG. 5C, may extend through baffle 550, and extend in between the dielectric fluid boiling fins 504, which themselves may also extend through baffle 550. In one implementation, the plurality of thermally conductive fins and the plurality of dielectric fluid boiling fins 504 may be in thermal contact with baffle 550 to facilitate transfer of heat from the electronic component(s) 505 to the liquid-cooled heat sink 530 via the plurality of thermally conductive fins. As with the configuration of FIG. 5A, the cooled electronic assembly 500' of FIG. 5C is configured, in one embodiment, to facilitate local in situ vapor condensation and/or heat transfer from the dielectric fluid boiling fins 504 to the plurality of thermally conductive fins 535, either via the dielectric fluid, dielectric fluid vapor, or even the baffle, should the baffle be thermally conductive and in thermal contact with the boiling fins and condensing fins.

FIGS. 6A-6D depict further variations of the cooled electronic systems described above in connection with FIGS. 5A-5C.

Figure 6A:
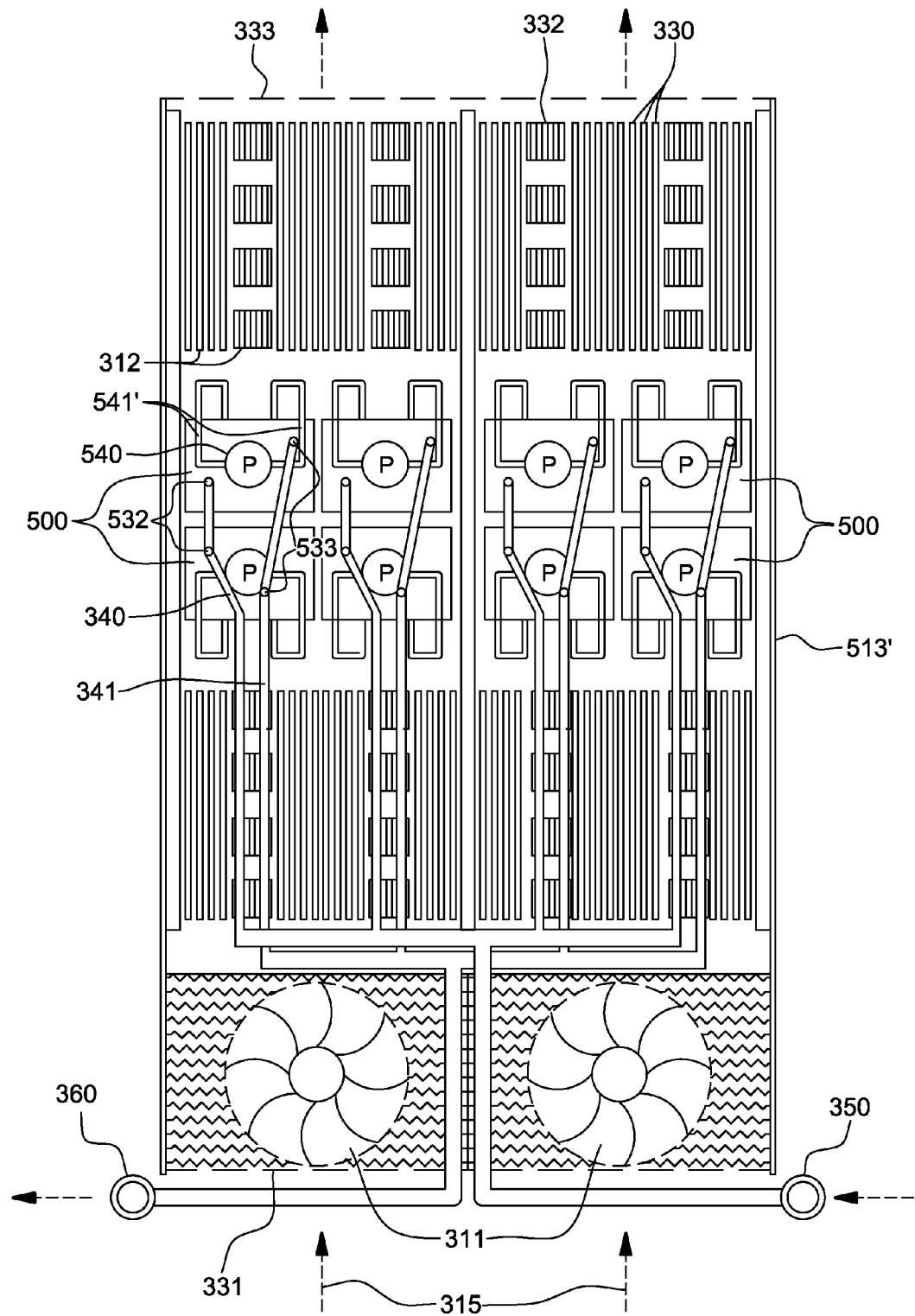
FIG. 6A is a plan view of another embodiment of a cooled electronic system (e.g., subsystem or node) layout, illustrating air and liquid-cooling of system components, wherein the pumps of the cooling apparatus are disposed over the cooled electronic assemblies, in accordance with an aspect of the present invention.

In FIG. 6A, a cooled electronic system 513' component layout is depicted that is similar to that described above in connection with FIG. 5B, except in this embodiment, the fluid pumps 540 are disposed over the cooled electronic assemblies 500, and the dielectric fluid tubes 541' are reconfigured to allow for the pumped supply and return of dielectric fluid from the compartment of the respective cooled electronic assembly 500. Advantageously, disposing the dielectric fluid pumps 540 over the cooled electronic assemblies, and in particular, over the liquid-cooled heat sink thereof, saves space within the component layout of the cooled electronic system. In this implementation, the dielectric fluid loop tubing 541' may be flexible tubing, which would allow for the fluid pump 540 to be repositioned out of the way of the respective liquid-cooled heat sink should the liquid-cooled heat sink need to be removed from the respective cooled electronic assembly 500.

Figure 6B:
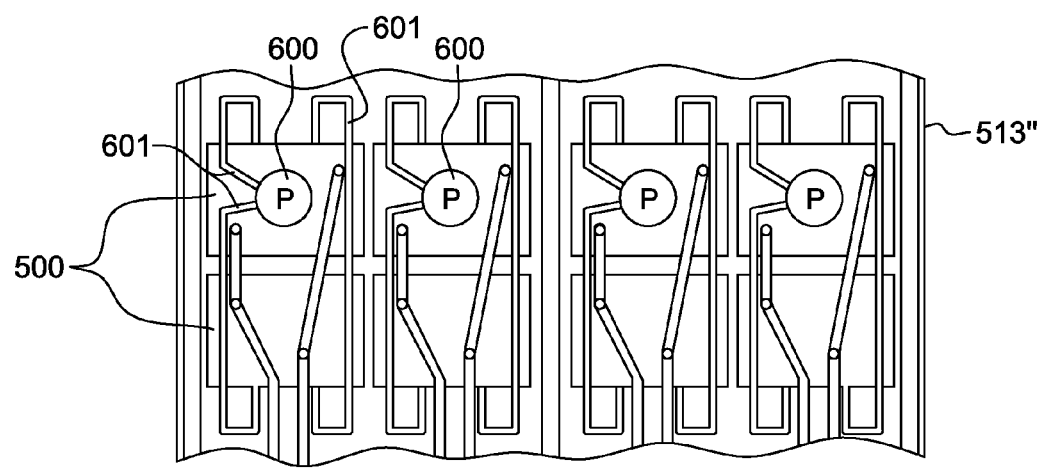
FIG. 6B is a partial depiction of an alternate embodiment of the cooled electronic system layout of FIG. 6A, which illustrates multiple cooled electronic assemblies coupled in series fluid communication with a shared external pump disposed over one of the cooled electronic assemblies, in accordance with one or more aspects of the present invention.

FIG. 6B is a partial depiction of another cooled electronic system 513" component layout, and cooling apparatus, in accordance with one or more aspects of the present invention. This cooling apparatus includes a plurality of cooled electronic assemblies 500 such as described above in connection with FIG. 5A or 5C, each coupled to receive pumped dielectric fluid via dielectric fluid tubing 601 and a fluid pump 600. As illustrated in FIG. 6B, each fluid pump 600, pumps dielectric fluid via dielectric fluid tubing 601 to multiple cooled electronic assemblies 500, coupled, for instance, in series-fluid communication.

Figure 6C:
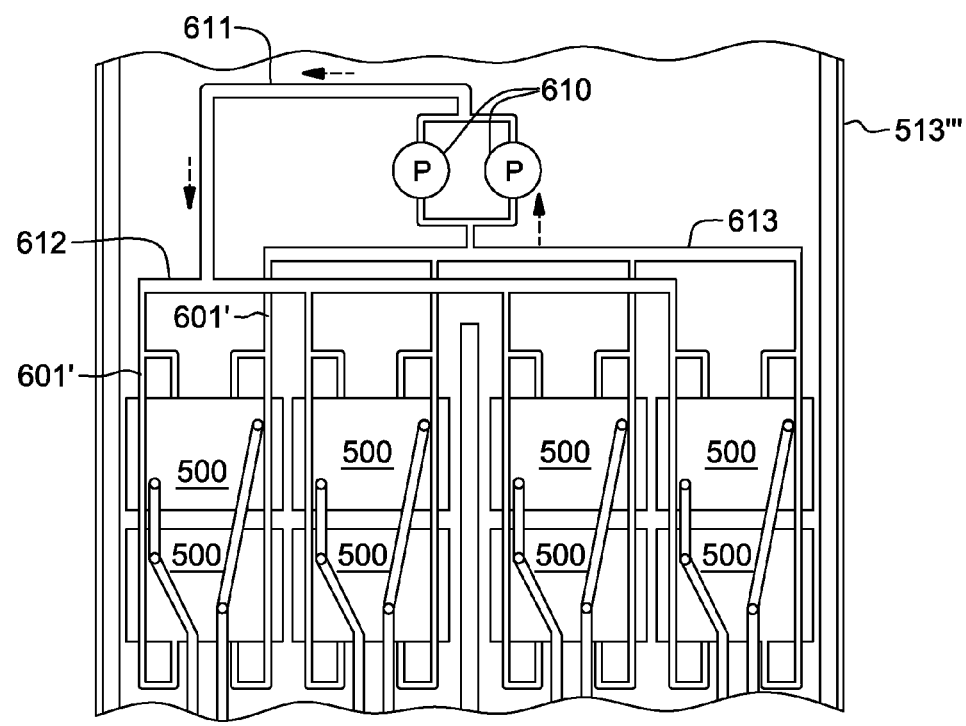
FIG. 6C is a partial depiction of another embodiment of the cooled electronic system layout of FIG. 6A, which illustrates another coupled configuration of the external pumps, wherein redundant pumps are coupled in parallel for pumping dielectric fluid flow through the cooled electronic assemblies, in accordance with one or more aspects of the present invention.

FIG. 6C is a partial depiction of a further cooled electronic system 513''' component layout similar to that described above in connection with FIG. 5B. In this embodiment, however, in-system redundant pumps 610 are coupled in parallel to provide pumped dielectric fluid to the cooled electronic assemblies 500 via a dielectric fluid flow loop comprising a dielectric fluid supply line 611, dielectric fluid supply manifold 612, dielectric fluid tubing 601', and dielectric fluid return manifold 613, as illustrated in FIG. 6C. In this embodiment, the redundant pumps 610 comprise centralized, node-level dielectric fluid pumps providing pumped dielectric fluid to all of the cooled electronic assemblies (or modules) of the system via the dielectric fluid loop or network of dielectric fluid plumbing. As in the above-described implementations, the dielectric fluid flow loop is independent of the system coolant supply loop supplying coolant (such as water) to the liquid-cooled heat sinks of the cooled electronic assemblies 500.

Figure 6D:
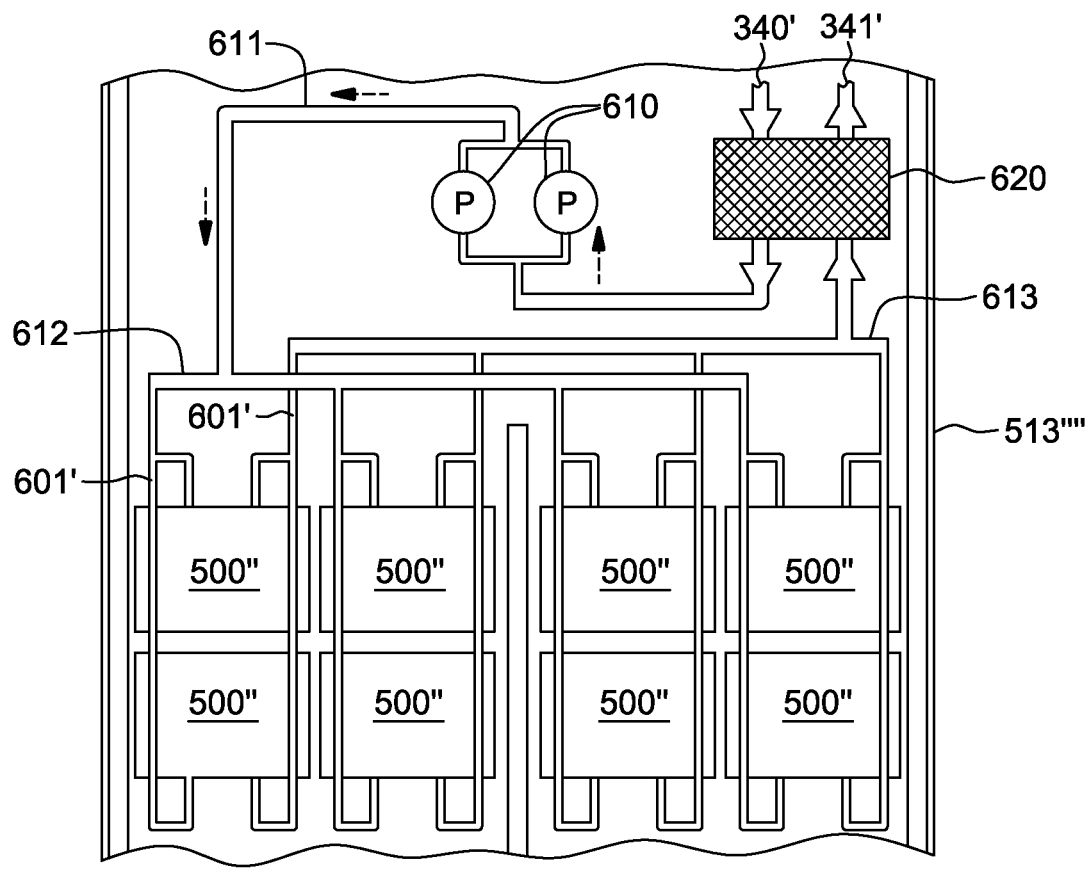
FIG. 6D is a partial plan view of another embodiment of a cooled electronic system layout, wherein pumped immersion-cooling of electronic components within multiple cooled electronic assemblies is provided along with a node-level, liquid-to-liquid heat exchanger for rejecting heat from the pumped dielectric fluid to a liquid coolant, in accordance with one or more aspects of the present invention.

FIG. 6D is a partial depiction of still another embodiment of a cooled electronic system 513'''' component layout and cooling apparatus, in accordance with one or more aspects of the present invention. In this implementation, a piping configuration similar to that described above in connection with FIG. 6C is depicted, however, a liquid-to-liquid heat exchanger 620 is added to the dielectric fluid flow loop to facilitate heat transfer from the dielectric fluid to system coolant supplied to heat exchanger 620 via a coolant supply tube 340' and a coolant return tube 341', which are coupled to the respective supply and return manifolds 350, 360, such as described above in connection with FIG. 3. In this implementation, the cooled electronic assemblies 500'' are similar to the cooled electronic assemblies 500 in FIG. 5A, except the liquid-cooled heat sinks of FIG. 5A are eliminated, with heat transfer occurring at the liquid-to-liquid heat exchanger 620, that is, at the node level of the cooled electronic system, rather than at the module or assembly level. Note that, in this implementation, it is assumed that single-phase dielectric fluid heat transfer is employed within the cooled electronic system.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A cooling apparatus comprising:
   an enclosure comprising a compartment accommodating at least one electronic component to be cooled;
   a dielectric fluid circulating through the compartment and at least partially immersing the at least one electronic component to be cooled;
   a liquid-cooled heat sink associated with the enclosure and cooling a plurality of fins disposed in an upper region of the compartment, the plurality of fins facilitating heat transfer to the liquid-cooled heat sink from the at least one electronic component via the dielectric fluid within the compartment;
   a pump disposed external to the enclosure and coupled in fluid communication with the compartment to facilitate pumped dielectric fluid flow into and out of the enclosure through the compartment, the pumped dielectric fluid flow through the compartment enhancing heat transfer from the at least one electronic component to the liquid-cooled heat sink via the plurality of fins, the pumped dielectric fluid flow at least partially immersing the plurality of fins;
   a dielectric fluid inlet and a dielectric fluid outlet associated with the enclosure to allow the pumped dielectric fluid flow into and out of the enclosure and through the compartment; and
   a baffle disposed within the compartment and directing the pumped dielectric fluid flow into the enclosure across the at least one electronic component, and then across the plurality of fins downstream of the least one electronic component, before exiting through the dielectric fluid outlet.

2. The cooling apparatus of claim 1, wherein the pumped dielectric fluid flow provides two-phase cooling of the at least one electronic component, and the plurality of fins comprise a plurality of condenser fins.

3. The cooling apparatus of claim 2, further comprising a plurality of dielectric fluid boiling fins coupled to the at last one electronic component, the plurality of dielectric fluid boiling fins facilitating heat transfer from the at least one electronic component to the pumped dielectric fluid flow through the compartment via flow boiling.

4. The cooling apparatus of claim 3, wherein the plurality of dielectric fluid boiling fins are, at least partially, interleaved with the plurality of condenser fins.

5. The cooling apparatus of claim 3, wherein the plurality of fins and the plurality of dielectric fluid boiling fins extend through the baffle.

6. The cooling apparatus of claim 1, wherein the pump draws single-phase liquid dielectric fluid from the compartment and provides single-phase liquid dielectric fluid to the compartment to facilitate the pumped dielectric fluid flow through the compartment.

7. The cooling apparatus of claim 1, wherein the liquid-cooled heat sink is disposed over the compartment, and the pump is mounted on top of the liquid-cooled heat sink.

8. The cooling apparatus of claim 1, further comprising at least one other enclosure comprising at least one other compartment accommodating at least one other electronic component to be cooled, and wherein the pump further facilitates pumped dielectric fluid flow through the at least one other compartment, at least partially immersing the at least one other electronic component to be cooled.

9. The cooling apparatus of claim 1, wherein the plurality of fins contact the baffle.

10. The cooling apparatus of claim 1, wherein the plurality of fins extend through the baffle.

11. A cooled electronic system comprising:
at least one electronic component; and
a cooling apparatus comprising:
- an enclosure comprising a compartment accommodating at least one electronic component to be cooled;
- a dielectric fluid circulating through the compartment and at least partially immersing the at least one electronic component to be cooled;
- a liquid-cooled heat sink associated with the enclosure and cooling a plurality of fins disposed in an upper region of the compartment, the plurality of fins facilitating heat transfer to the liquid-cooled heat sink from the at least one electronic component via the dielectric fluid within the compartment;
- a pump disposed external to the enclosure and coupled in fluid communication with the compartment to facilitate pumped dielectric fluid flow into and out of the enclosure through the compartment, the pumped dielectric fluid flow through the compartment enhancing heat transfer from the at least one electronic component to the liquid-cooled heat sink via the plurality of fins, the pumped dielectric fluid flow at least partially immersing the plurality of fins;
- a dielectric fluid inlet and a dielectric fluid outlet associated with the enclosure to allow the pumped dielectric fluid flow into and out of the enclosure and through the compartment; and
- a baffle disposed within the compartment and directing the pumped dielectric fluid flow into the enclosure across the at least one electronic component, and then across the plurality of fins downstream of the at least one electronic component, before exiting through the dielectric fluid outlet.

12. The cooled electronic system of claim 11, wherein the pumped dielectric fluid flow provides two-phase cooling of the at least one electronic component, and the plurality of fins comprise a plurality of condenser fins.

13. The cooled electronic system of claim 12, further comprising a plurality of dielectric fluid boiling fins coupled to the at least one electronic component, the plurality of dielectric fluid boiling fins facilitating heat transfer from the at least one electronic component to the pumped dielectric fluid flow through the compartment via flow boiling, and wherein the plurality of dielectric fluid boiling fins are, at least partially, interleaved with the plurality of condenser fins.

14. The cooled electronic system of claim 13, wherein the plurality of fins and the plurality of dielectric fluid boiling fins extend through the baffle.

15. The cooled electronic system of claim 11, wherein the at least one pump draws single-phase liquid dielectric fluid from the compartment and provides single-phase liquid dielectric fluid to the compartment to facilitate the pumped dielectric fluid flow through the compartment.

16. The cooled electronic system of claim 11, wherein the at least one liquid-cooled heat sink is disposed over the compartment, and the at least one pump is mounted on top of the liquid-cooled heat sink.

17. The cooled electronic system of claim 11, further comprising at least one other enclosure comprising at least one other compartment accommodating at least one other electronic component to be cooled, and wherein the at least one pump further facilitates pumped dielectric fluid flow through the at least one other compartment, at least partially immersing the at least one other electronic component to be cooled.

18. The cooled electronic system of claim 11, wherein the plurality of fins contact the baffle.

19. The cooled electronic system of claim 11, wherein the plurality of fins extend through the baffle.

* * * * *